United States Patent
Park et al.

(10) Patent No.: US 7,987,411 B1
(45) Date of Patent: Jul. 26, 2011

(54) METHOD AND APPARATUS FOR WRITING DATA TO MPE BUFFER AND AN MPE-FEC SYSTEM

(75) Inventors: Jae-hong Park, Suwon-si (KR); Ryan Kim, Yongin-si (KR); Dae-hwan Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 1126 days.

(21) Appl. No.: 11/739,988

(22) Filed: Apr. 25, 2007

(51) Int. Cl.
*H03M 13/00* (2006.01)

(52) U.S. Cl. .................. 714/784; 714/758; 714/785

(58) Field of Classification Search ............ 714/758, 714/784, 785
See application file for complete search history.

(56) References Cited

U.S. PATENT DOCUMENTS

| | | | |
|---|---|---|---|
| 7,508,839 B2* | 3/2009 | Vesma et al. | 370/466 |
| 7,584,495 B2* | 9/2009 | Hannuksela et al. | 725/101 |
| 7,610,544 B2* | 10/2009 | Guo | 714/776 |
| 7,644,343 B2* | 1/2010 | Gubbi et al. | 714/776 |
| 7,737,930 B2* | 6/2010 | Inuzuka et al. | 345/87 |
| 7,823,048 B2* | 10/2010 | Alamaunu et al. | 714/776 |

FOREIGN PATENT DOCUMENTS

| | | |
|---|---|---|
| JP | 2001-251196 | 9/2001 |
| JP | 2005-142812 | 6/2005 |
| KR | 1020000076589 | 12/2000 |

* cited by examiner

*Primary Examiner* — Esaw T Abraham
(74) *Attorney, Agent, or Firm* — F. Chau & Associates, LLC

(57) ABSTRACT

A method for writing data to a multi-protocol encapsulation (MPE) buffer includes the steps of determining whether an error is generated in address information of an MPE section by comparing a location of an erasure table referring to the address of the MPE section, with address information of the MPE section, and when the error is generated in the address information of the MPE section, preventing writing data of the MPE section to a location of the MPE buffer referring to the address information of the MPE section, and when the error is not generated, writing the data of the MPE section to the location of the MPE buffer.

9 Claims, 4 Drawing Sheets

METHOD AND APPARATUS FOR WRITING DATA TO MPE BUFFER AND AN MPE-FEC SYSTEM

BACKGROUND OF THE INVENTION

1. Technical Field

The present disclosure relates to a method and apparatus for writing data to a Multi-Protocol Encapsulation (MPE) buffer and an MPE-Forward Error Correction (MPE-FEC) system

2. Discussion of the Related Art

Digital Video Broadcasting-Handheld (DVB-H) is a technology standard established in Europe to improve the reception rate of a terrestrial Digital television (DTV) which is carried by a moving user. Multi-Protocol Encapsulation-Forward Error Correction (MPE-FEC) is a technique of performing FEC based on erasure information, MPE-FEC is performed to improve the performance reception of DVB-H when the DIV is in motion.

MPE-FEC systems generally operate in environments where receiving conditions significantly change. Thus, it is highly likely that an error will be generated in the address information of an MPE section. When this occurs, a typical MPE-FEC system is likely to write IP data to a wrong location of an MPE-FEC frame table.

SUMMARY OF THE INVENTION

According to an exemplary embodiment of the present invention, there is provided a method of writing data to a multi-protocol encapsulation (MPE) buffer. The method includes the steps of determining whether an error is generated in address information of an MPE section by comparing a location of an erasure table referring to the address of the MPE section, with address information of the MPE section, and when the error is generated in the address information of the MPE section, preventing writing of data of the MPE section to a location of the MPE buffer referring to the address information of the MPE section, and when the error is not generated, writing the data of the MPE section to the location of the MPE buffer.

According to an exemplary embodiment of the present invention, there is provided a multi-protocol encapsulation (MPE)-forward error correction (FEC) system. The system includes an erasure table storing erasure information, an MPE buffer storing IP (Internet Protocol) data, an address error determining unit receiving an address of an MPE section, and determining whether an error is generated in address information of the MPE section by comparing a location of the erasure table referring to the address of the MPE section with the address information of the MPE section, and a writing controller which prevents writing of IP data of the MPE section to a location of the MPE buffer referring to the address information of the MPE section, when the error is generated in the address information, and writes the IP data of the MPE section to the buffer when the error is not generated.

According to an exemplary embodiment of the present invention, there is provided an apparatus for writing data to a multi-protocol encapsulation (MPE) buffer. The apparatus includes an address error determining unit determining whether an error is generated in address information of an MPE section by comparing a location of an erasure table referring to the address of the MPE section with the address information of the MPE section, and a writing controller which prevents writing of data of the MPE section to a location of the MPE buffer referring to the address information of the MPE section, when the error is generated in the address information, and writes the data of the MPE section to the buffer when the error is not generated.

BRIEF DESCRIPTION OF THE DRAWINGS

The above and other aspects of the present invention will become more apparent by describing in detail exemplary embodiments thereof with reference to the attached drawings in which.

DETAILED DESCRIPTION OF EXEMPLARY EMBODIMENTS

Figure 1:
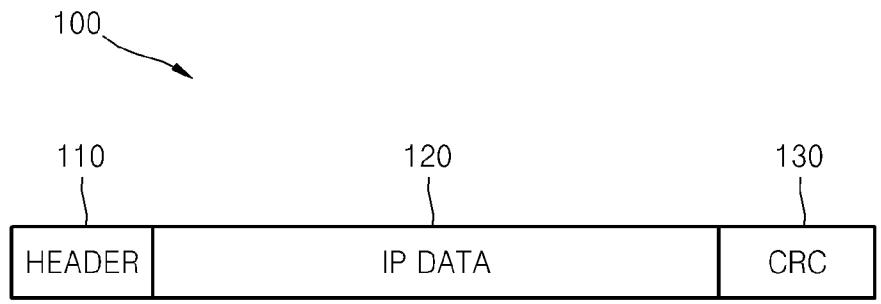
FIG. 1 is a diagram illustrating the construction of a Multi-Protocol Encapsulation (MPE) section.

Hereinafter, exemplary embodiments of the present invention will be described in detail with reference to the accompanying drawings. Like reference numerals denote like elements throughout the drawings.

FIG. 1 is a diagram illustrating the construction of a Multi-Protocol Encapsulation (MPE) section 100. The MPE section 100 includes a header 110, an IP (Internet Protocol) data (payload) field 120, and a CRC field 130. The header 110 includes a table_id field, a section_length field, a padding_column field, a table_boundary field, a frame_boundary field, and an address field. The table_id field indicates whether the MPE section 100 is an MPE-FEC section. The section_length field records the length from the fourth bit of the MPE section 100 to the end thereof. The padding_column field records the number of columns that are to be padded with a value of 0 into an MPE-FEC frame table. The table_boundary field indicates whether the MPE section 100 is a last section of the MPE-FEC frame table. The number of the padded columns ranges from 0 to 190. The frame_boundary field indicates whether the MPE section 100 is a last section of a current MPE-FEC frame. The address field records the address of the MPE-FEC frame referring to a first byte of the payload of the MPE section 100.

Figure 2:
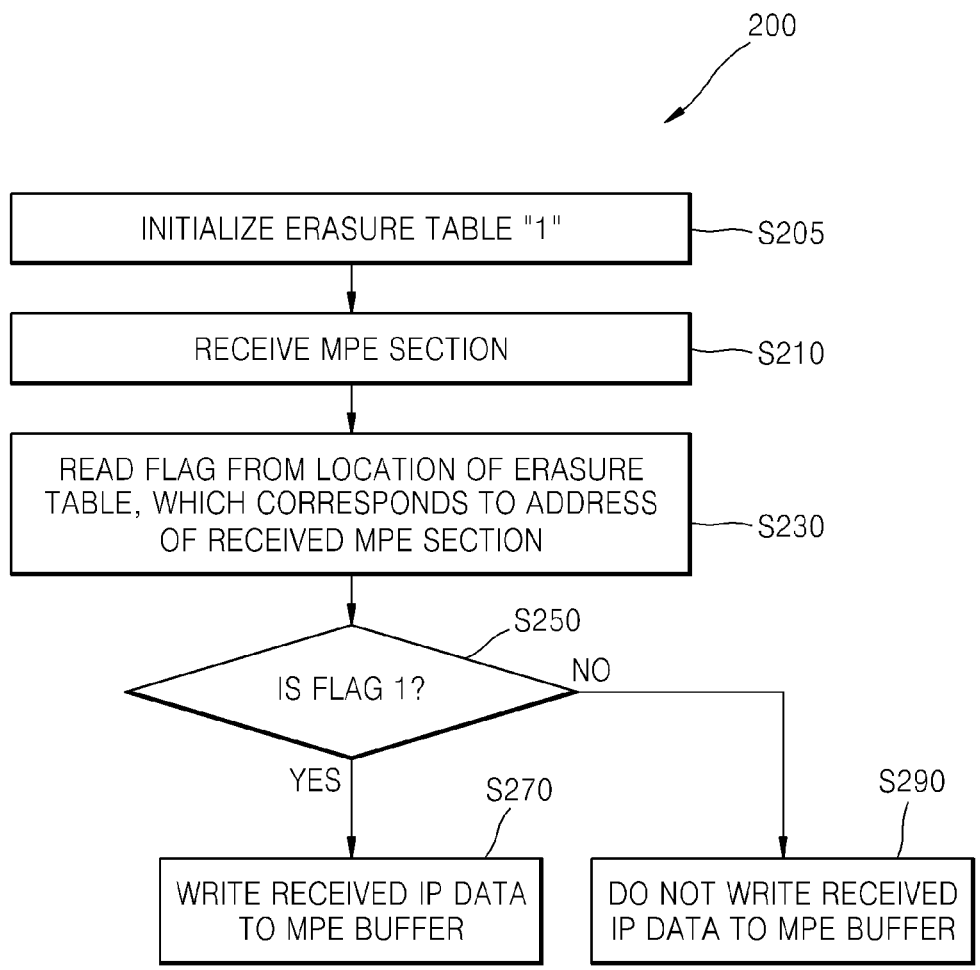
FIG. 2 is a flowchart illustrating a method of writing data to an MPE buffer according to an exemplary embodiment of the present invention.

FIG. 2 is a flowchart illustrating a method 200 of writing data to an MPE buffer according to an exemplary embodiment of the present invention. The data may be IP (internet protocol) data. Referring to FIG. 2, the method 200 includes operations of determining whether an error is generated in address information of an MPE section (S230 and S250), and writing data of an MPE section to the MPE buffer (S270 and S290).

In operations S230 and S250, whether an error generated in the address information of the MPE section is determined by comparing a location of an erasure table referring to the address of the MPE section with the address information of the MPE section. In operations S270 and S290, when it is determined that an error is generated in the address information of the MPE section, the data of the MPE section prevented from being written to a location of the MPE buffer referring to the address information of the MPE section (S290), and when it is determined that an error is not generated, the data of the MPE section is written to the location of the MPE buffer referring to the address information of the MPE section (S270).

Operations S230 and S250 include reading a flag (S230) and checking the value of the flag (S250). In operation S230, the flag is read from the location of the MPE buffer referring to the address information of the MPE section of the erasure table. In operation S250, whether an error is generated in the address information of the MPE section is determined based on the read flag.

For example, in operation S250, when the flag is not 1, it is determined that an error is generated in the address information of the MPE section, and when the flag is 1 it is determined that an error is not generated.

The method 200 may further include initializing the erasure table as 1 (S205). In addition, the method 200 may further include receiving the MPE section (S210).

Figure 3:
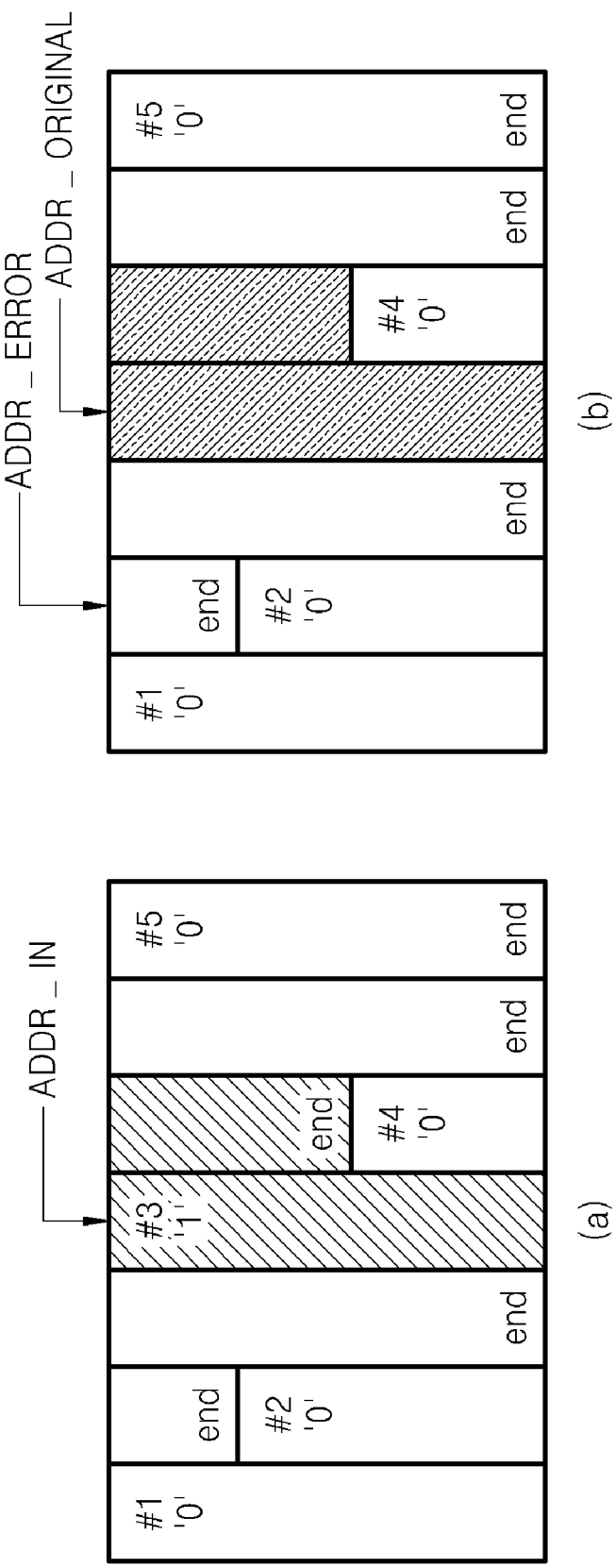
FIG. 3 is a diagram illustrating a method of writing data to an MPE buffer according to an exemplary embodiment of the present invention.

FIG. 3 is a diagram illustrating a method of writing data to an MPE buffer according to an exemplary embodiment of the present invention. FIG. 3(a) illustrates an MPE-FEC frame table in which an error is not generated in address information ADDR_IN of a received MPE section, and FIG. 3(b) illustrates an MPE-FEC frame table in which an error is generated in address information ADDR_ERROR of the received MPE section.

Referring to FIG. 3(a), when an error is not generated in the address information ADDR_IN of the received MPE section, IP data is written to a region of the MPE buffer, i.e., a slanted region, which is indicated by the address information ADDR_IN.

Referring to FIG. 3(b), when an error is generated in the address information ADDR_ERROR of the received MPE section, IP data is prevented from being written to a region of the MPE buffer, which is indicated by the address information ADDR_ERROR. In addition, the IP data is prevented from being written to a region of the MPE buffer, i.e. a slanted region, which is indicated by the original address information ADDR_ORIGINAL. The original address information ADDR_ORIGINAL is address information referring to the address information ADDR_ERROR assuming that the error had not been generated in the address information ADDR_ERROR of the MPE section.

Figure 4:
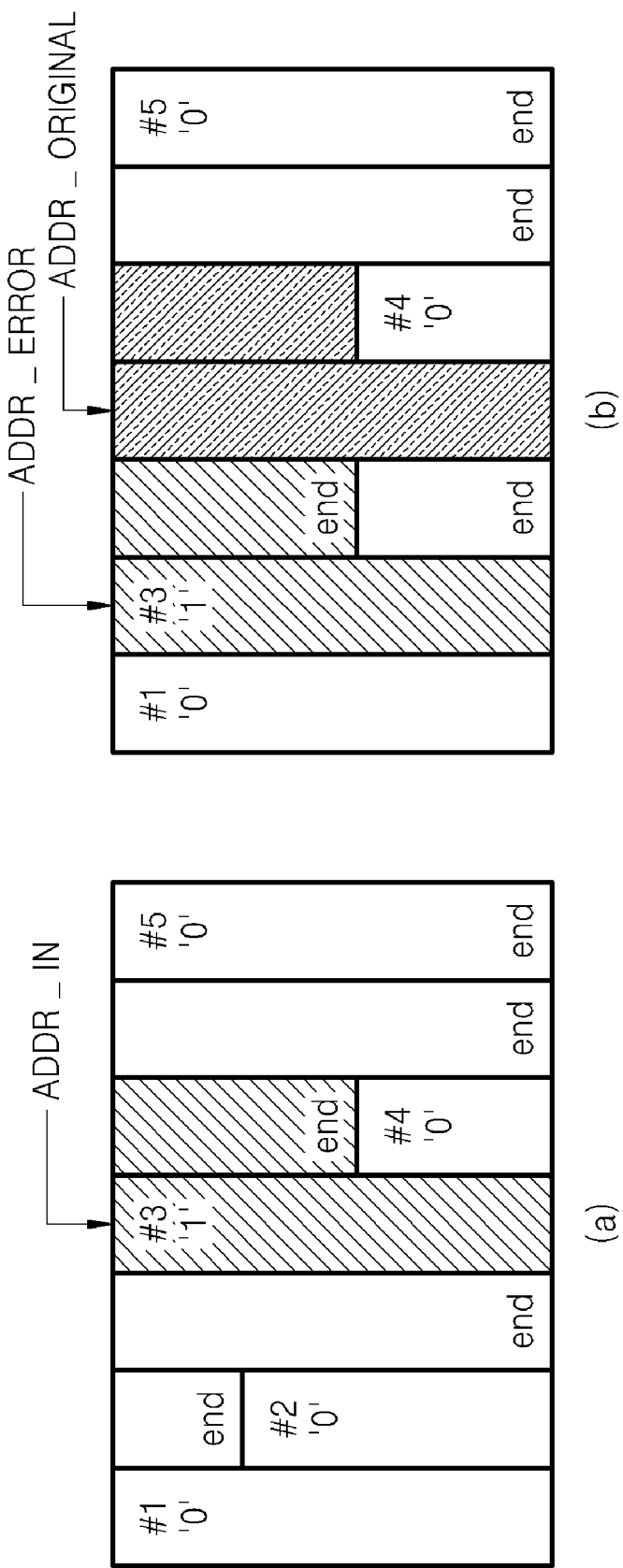
FIG. 4 is a diagram illustrating a conventional method of writing data to an MPE buffer.

FIG. 4 is a diagram illustrating a conventional method of writing data to an MPE buffer, FIG. 4(a) illustrates an MPE-FEC frame table in which an error is not generated in address information ADDR_IN of a received MPE section, and FIG. 4(b) illustrates an MPE-FEC frame table in which an error is generated in address information ADDR_ERROR of the received MPE section.

Referring to FIG. 4(a), in the conventional method of writing data to an MPE buffer, when an error is not generated in the address information ADDR_IN of the received MPE section, IP data is written to a region of the MPE buffer, i.e., a slanted region, which is indicated by the address information ADDR_IN, similarly as in the present invention.

Referring to FIG. 4(b), in the conventional method, when an error is generated in the address information ADDR_ERROR of the received MPE section, IP data is written to a region of the MPE buffer, which is indicated by the address information ADDR_ERROR. In addition, the IP data is prevented from being written to a region of the MPE buffer, i.e., a slanted region, which is indicated by the original address information ADDR_ORIGINAL. The original address information ADDR_ORIGINAL is address information referring to the address information ADDR_ERROR assuming that the error had not been generated in the address information ADDR_ERROR of the MPE section.

Accordingly, the conventional method of writing data to a region of an MPE buffer incorrectly writes IP data to a region of the MPE buffer, which is indicated by address information ADDR_ERROR containing an error. Thus, regions indicated by address information ADDR_ERROR and address information ADDR_ORIGINAL are processed as error regions. In a method of writing data to an MPE buffer according to an exemplary embodiment of the present invention, IP data is prevented from being written to a region of the MPE buffer, which is indicated by the address information ADDR_ERROR containing an error.

Figure 5:
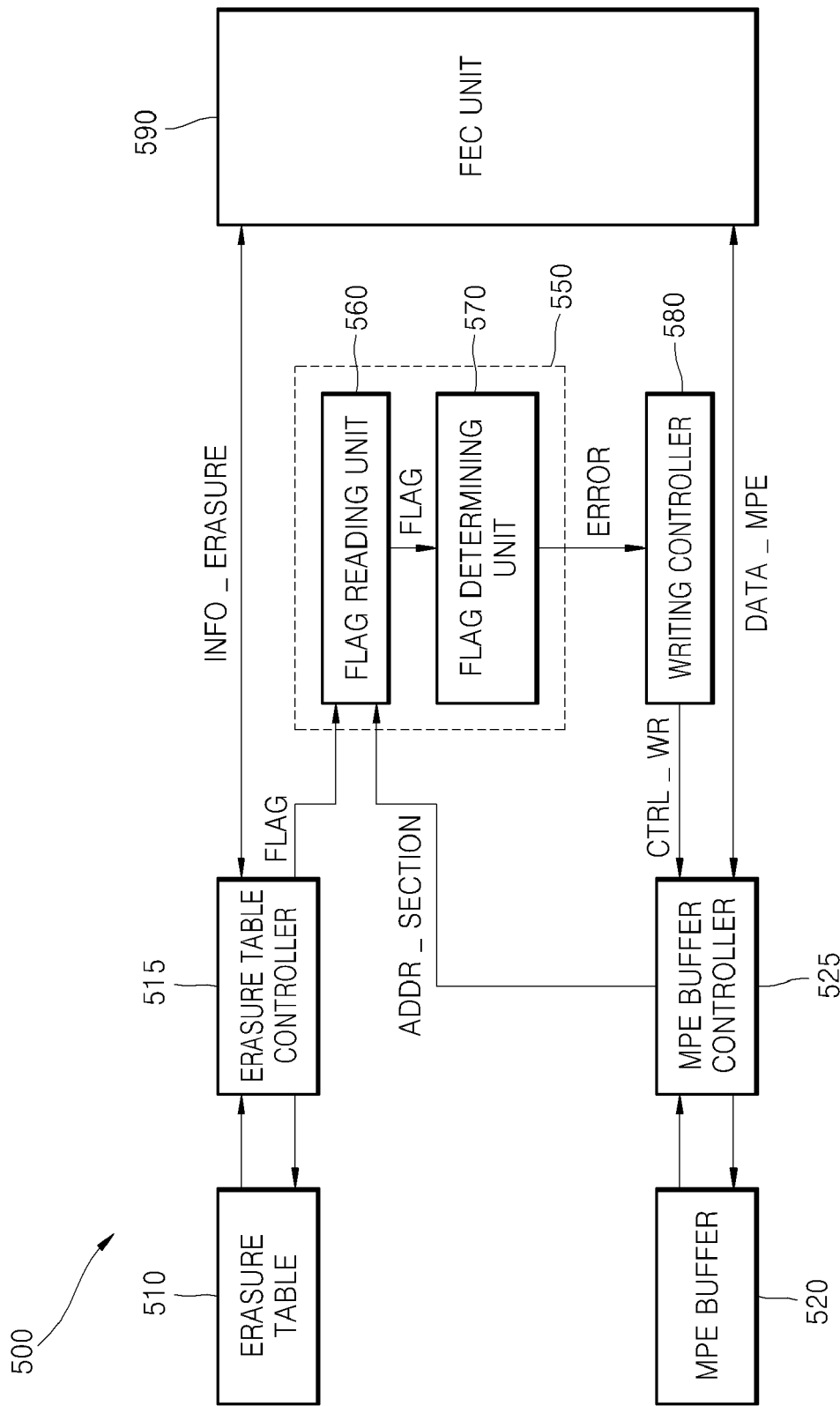
FIG. 5 is a block diagram of an apparatus for writing data to an MPE buffer and an MPE-FEC system having the apparatus, according to an exemplary embodiment of the present invention.

FIG. 5 is a block diagram of an apparatus for writing data to an MPE buffer according to an exemplary embodiment of the present invention and of an MPE-FEC system 500 having the same according to an exemplary embodiment of the present invention. Referring to FIG. 5, the MPE-FEC system 500 includes an erasure table 510, the MPE buffer 520, an address error determining unit 550, and a writing controller 580. FIG. 5 further illustrates an FEC unit 590 that performs FEC.

The erasure table 510 stores erasure information INFO_ERASURE. The erasure information INFO_ERASURE may include a flag. The MPE buffer 520 stores IP data. The address error determining unit 550 receives address information ADDR_SECTION of an MPE section, and determines whether an error is generated in the address information ADDR_SECTION by comparing a location of the erasure table 510 referring to the address info nation ADDR_SECTION, and the address information ADDR_SECTION. The address error determining unit 550 inputs the determined result ERROR to the writing controller 580. When an error is generated in the address information ADDR_SECTION, the writing controller 580 prevents writing of IP data of the MPE section to a location of the MPE buffer 520 referring to the address information ADDR_SECTION. When the error is not generated, the writing controller 580 writes the IP data of the MPE section to the MPE buffer 520.

The address error determining unit 550 may include a flag reading unit 560 and a flag determining unit 570. The flag reading unit 560 reads the flag from a location of the erasure table 510 referring to the address information ADDR_SECTION. When the flag is not 1, the flag determining unit 570 may determine that an error is generated in the address information ADDR_SECTION. When the flag is 1, the flag determining unit 570 may determine that an error is not generated in the address information ADDR_SECTION.

In an exemplary embodiment of the present invention, the MPE-FEC system 500 may further include an erasure table controller 515. The erasure table controller 515 reads the address information ADDR_SECTION from the erasure table 510. In an exemplary embodiment of the present invention, the MPE-FEC system 500 may further include an MPE buffer controller 525. The MPE buffer controller 525 writes IP data to the MPE buffer 520. The writing controller 580 may input a write control signal CTRL_WR to the MPE buffer controller 525 which instructs the MPE buffer controller 525 to write the IP data.

An apparatus for writing data to an MPE buffer according to an exemplary embodiment of the present invention includes the address error determining unit 550 and the writing controller 580 illustrated in FIG. 5.

The address error determining unit 550 receives address information ADDR_SECTION of an MPE section, and determines whether an error is generated in the address information ADDR_SECTION by comparing a location of the MPE buffer referring to the address information ADDR_SECTION, and the address information ADDR_SECTION in the erasure table 510. When an error is generated in the address information ADDR_SECTION, the writing controller 580 prevents writing of IP data of the MPE section to a location of an MPE buffer referring to the address information ADDR_SECTION. When the error is not generated, the writing controller 580 writes the IP data of the MPE section to the MPE buffer.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A method of writing data to a multi-protocol encapsulation (MPE) buffer, the method comprising:
    receiving an MPE section that includes address information and internet protocol (IP) data;
    reading a flag from a location of an erasure table that references the address, wherein the flag is one of a first value and a second value, the first value indicating an absence of an error in address information of a MPE section and the second value indicating a presence of an error in address information of a MPE section; and
    writing the IP data of the received MPE section to a location of a MPE buffer referring to the address information of the received MPE section when the read flag is set to the first value and prevent writing the IP data of the received MPE section to the MPE buffer when the read flag is set to the second value.

2. The method of claim 1, wherein the first value is 1 and the second value is not 1.

3. The method of claim 1, wherein prior to receipt of the MPE section, all entries of the erasure table are initialized to 1.

4. An apparatus for writing data to a multi-protocol encapsulation (MPE) buffer, the apparatus comprising:
    an MPE buffer controller that outputs address information of a MPE section and writes internet protocol (IP) data of the MPE section to a location of the MPE buffer that corresponds to the address information in response to a write control signal;
    an erasure table storing erasure information and including at least one flag;
    a flag reading unit that reads a flag from a location of the erasure table that refers to the address information of the MPE section;
    a flag determining unit that determines based on a value of the read flag whether the address information contains an error and outputs the determination; and
    a writing controller that outputs the write control signal to the MPE buffer controller when the determination indicates the address information is absent an error and prevents writing of the IP data of the MPE section to the location of the MPE buffer when the determination indicates a presence of an error in the address information.

5. The apparatus of claim 4, wherein the flag determining unit determines that the address information contains an error when the flag is not 1, and that the address information is absent an error when the flag is 1.

6. The apparatus of claim 4, further comprising an erasure table controller that reads the erasure information from the erasure table and outputs the flag from the erasure table to the flag reading unit.

7. A multi-protocol encapsulation (MPE)-forward error correction (FEC) system, comprising:
    an erasure table storing erasure information and at least one flag;
    an MPE buffer storing Internet Protocol (IP) data;
    an MPE buffer controller that outputs an address information of the MPE section and writes internet protocol (IP) data of the MPE section to a location of the MPE buffer that corresponds to the address information in response to a write control signal;
    a flag reading unit that reads a flag from a location of the erasure table that refers to the address information of the MPE section;
    a flag determining unit that determines based on a value of the read flag whether the address information contains an error and outputs the determination;
    a writing controller that outputs the write control signal to the MPE buffer controller when the determination indicates the address information is absent an error and prevents writing of the IP data of the MPE section to the location of the MPE buffer when the determination indicates a presence of an error in the address information.

8. The system of claim 7, wherein the flag determining unit determines that the address information contains an error when the flag is not 1, and that the address information is absent an error when the flag is 1.

9. The system of claim 7, further comprising an erasure table controller reading the erasure information from the erasure table and outputting the flag of the erasure table to the flag reading unit.

* * * * *